(12) United States Patent
Makkonen et al.

(10) Patent No.: US 11,088,670 B2
(45) Date of Patent: Aug. 10, 2021

(54) LOADED SERIES RESONATORS FOR ADJUSTING FREQUENCY RESPONSE OF ACOUSTIC WAVE RESONATORS

(71) Applicant: VTT Technical Research Centre of Finland Ltd, Espoo (FI)

(72) Inventors: Tapani Makkonen, Espoo (FI); Markku Ylilammi, Espoo (FI); Tuomas Pensala, Espoo (FI); James Dekker, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 33 days.

(21) Appl. No.: 16/567,749

(22) Filed: Sep. 11, 2019

(65) Prior Publication Data
US 2021/0075392 A1    Mar. 11, 2021

(51) Int. Cl.
*H03H 9/02* (2006.01)
*H03H 9/205* (2006.01)
(Continued)

(52) U.S. Cl.
CPC ...... *H03H 9/02086* (2013.01); *H03H 9/0211* (2013.01); *H03H 9/02228* (2013.01);
(Continued)

(58) Field of Classification Search
CPC .... H03H 9/02086; H03H 9/605; H03H 9/205; H03H 9/0211; H03H 9/133; H03H 9/02228
(Continued)

(56) References Cited

U.S. PATENT DOCUMENTS

| 9,893,712 B2 | 2/2018 | Meltaus et al. |
| 2006/0091978 A1 | 5/2006 | Wang et al. |
(Continued)

FOREIGN PATENT DOCUMENTS

| EP | 1583233 | 12/2008 |
| EP | 2362545 | 8/2011 |
(Continued)

OTHER PUBLICATIONS

Fattinger et al. "Optimization of acoustic dispersion for high performance thin film BAW resonators," Proc. IEEE Internatl. Ultrasonics Symposium, 2005, pp. 1175-1178.
(Continued)

*Primary Examiner* — Robert J Pascal
*Assistant Examiner* — Jorge L Salazar, Jr.
(74) *Attorney, Agent, or Firm* — Fish & Richardson P.C.

(57) ABSTRACT

An acoustic wave filter device is disclosed. The device includes an acoustic wave filter element, and a first resonator and a second resonator coupled to the acoustic wave filter element. The acoustic wave filter element includes interdigited input electrodes and output electrodes located on a top surface of a piezoelectric layer. Each of the first and the second resonators includes a top electrode on the top surface, and a bottom electrode on the bottom surface of the piezoelectric layer. At least one of each of the first and the second resonators' electrodes is electrically connected to the acoustic wave filter element. The first resonator has a first notch in resonator impedance at a first frequency. The second resonator includes a first mass loading layer on the second resonator electrode such that the second resonator has a second notch in resonator impedance at a second frequency different from the first frequency.

19 Claims, 13 Drawing Sheets

(51) Int. Cl.
*H03H 9/13* (2006.01)
*H03H 9/60* (2006.01)

(52) U.S. Cl.
CPC ............ *H03H 9/133* (2013.01); *H03H 9/205* (2013.01); *H03H 9/605* (2013.01)

(58) Field of Classification Search
USPC .......................... 333/133, 186, 187, 193–196
See application file for complete search history.

(56) References Cited

U.S. PATENT DOCUMENTS

| | | |
|---|---|---|
| 2013/0278356 A1 | 10/2013 | Meltaus et al. |
| 2013/0321100 A1* | 12/2013 | Wang .................... H01L 41/107 333/187 |
| 2014/0312994 A1 | 10/2014 | Meltaus et al. |
| 2015/0341016 A1 | 11/2015 | Iwaki et al. |

FOREIGN PATENT DOCUMENTS

| | | |
|---|---|---|
| WO | WO 01/06647 | 1/2001 |
| WO | WO 2011/131844 | 10/2011 |
| WO | WO 2012/049372 | 4/2012 |
| WO | WO 2012/049374 | 4/2012 |
| WO | WO 2013/068652 | 5/2013 |
| WO | WO 2020/049170 | 3/2020 |

OTHER PUBLICATIONS

Meltaus et al., "Laterally Coupled BAW Filter using Two Acoustic Modes," Proc. IEEE Internatl. Ultrasonics Symposium, Jul. 2013, 232-5.

Meltaus et al., "Laterally Coupled BAW Filters with 5% Bandwidth," Proc. IEEE Internatl. Ultrasonics Symposium, Oct. 2010, 966-9.

Meltaus et al., "Laterally coupled solidly mounted BAW resonators at 1.9 GHz," Proc. IEEE International Ultrasonics Symposium, Sep. 2009, 847-50.

Pensala et al., "2-D Modeling of Laterally Acoustically Coupled Thin Film Bulk Acoustic Wave Resonator Filters," IEEE Transactions on ultrasonics, ferroelectrics, and frequency control, Nov. 2010, 57(11):2537-49.

Solie, "Tapered transducers—design and applications," Proc. IEEE Internatl Ultrasonics Symposium, 1998, 1:27-37.

PCT International Search Report and Written Opinion in International Appln. No. PCT/EP2020/075001, 22 pages, dated Nov. 2, 2020.

* cited by examiner

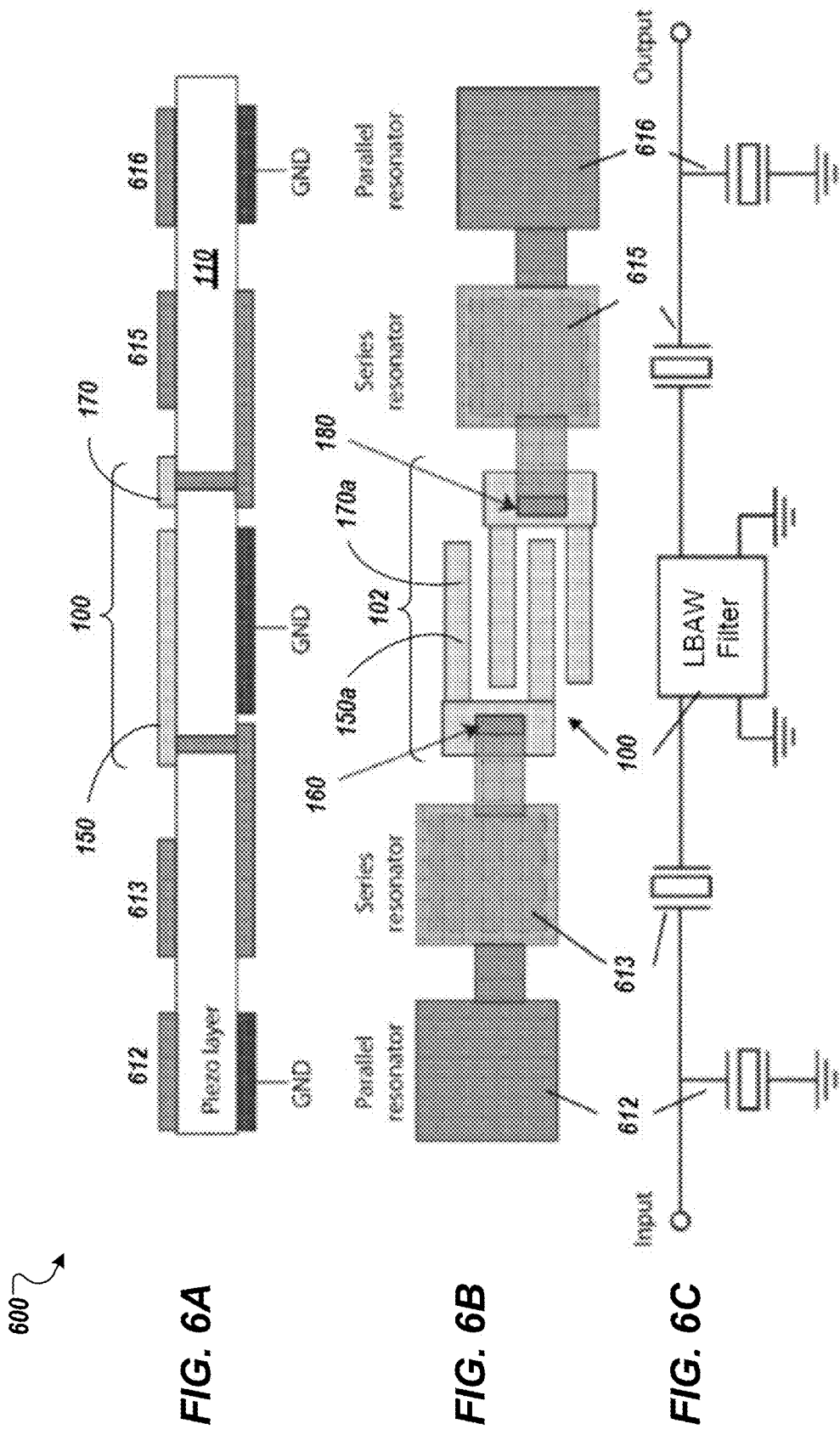

LOADED SERIES RESONATORS FOR ADJUSTING FREQUENCY RESPONSE OF ACOUSTIC WAVE RESONATORS

BACKGROUND

Technical Field

This specification relates to thin film radio-frequency acoustic wave filters.

Background

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for band pass Lateral Bulk Acoustic Wave ("LBAW") filters. More particularly, the present disclosure provides techniques to suppress sidebands in LBAW filters and improve band pass filter characteristic of LBAW filters.

LBAWs can be used as band pass filters. The band pass filter may include one or more undesired (or parasitic) sidebands. Implementations of the present disclosure provide techniques to suppress the undesired sidebands by adding one or more acoustic resonators in series with the LBAW.

LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

The foregoing and other embodiments can each optionally include one or more of the following features, alone or in combination.

In general, one innovative aspect of the subject matter described in this specification can be embodied in an acoustic wave filter device that includes an acoustic wave filter element, a first resonator, and a second resonator. The acoustic wave filter includes input electrodes and output electrodes located on a top surface of a piezoelectric layer. The first resonator includes a first resonator top electrode on the top surface of the piezoelectric layer and a first resonator bottom electrode on the bottom surface of the piezoelectric layer. The first resonator has a first notch in resonator impedance at a first frequency, wherein one of the top and the bottom electrodes of the first resonator is electrically connected to the acoustic wave filter element. The second resonator is coupled to the acoustic wave filter element and includes a second resonator top electrode on the top surface of the piezoelectric layer, a second resonator bottom electrode on the bottom surface of the piezoelectric layer, and a first mass loading layer on the second resonator top electrode such that the second resonator has a second notch in resonator impedance at a second frequency that is different from the first frequency. One of the top and the bottom electrodes of the second resonator is electrically connected to the acoustic wave filter element.

The first frequency and the second frequency can be within a sideband of resonator impedance of the acoustic wave filter element. The first frequency and second frequency can differ by at least 1%.

In some implementations, the first resonator bottom electrode is electrically coupled to the input electrodes, and the second resonator bottom electrode is electrically coupled to the output electrodes.

The first resonator top electrode can be an uppermost layer of the first resonator.

In some implementation, the first mass loading layer does not cover the second resonator top electrode.

The acoustic wave filter device can include a second mass loading layer on the first resonator top electrode. The first mass loading layer and the second mass loading layer can be the same material but have different thicknesses. The first mass loading layer and the second mass loading layer can be different materials with different density and/or different stiffness. In some implementations, the first mass loading layer does not cover the second resonator top electrode. In some implementations, the first mass loading layer covers the first resonator top electrode and the second mass loading layer does not cover the second resonator top electrode.

The first mass loading layer can be a different material than the second resonator top electrode.

The first mass loading layer can be the same material as the second resonator top electrode. The first resonator top electrode and second resonator top electrode can have different thicknesses.

In some implementations, the first resonator bottom electrode is electrically connected to the acoustic wave filter element by a first conductive via extending through the piezoelectric layer. The second resonator bottom electrode can be electrically connected to the acoustic wave filter element by a second conductive via extending through the piezoelectric layer.

The input electrodes, output electrodes, first resonator electrode, and/or second resonator electrode can be provided by separate portions of the same electrode layer on the top surface of the piezoelectric layer.

A thickness of the piezoelectric layer and a gap width between the input and output electrodes cam be such that application of a radio frequency voltage between the input electrodes and the counter-electrode will create symmetric and antisymmetric acoustic thickness-extensional resonance modes in the piezoelectric layer.

The acoustic wave filter device can include a counter-electrode located on a bottom surface of the piezoelectric layer below the interdigitated input electrodes and output electrodes. The acoustic wave filter element can be a laterally acoustically coupled bulk acoustic wave (LBAW) filter.

One innovative aspect of the subject matter described herein can be embodied in an acoustic wave filter device that includes an acoustic wave filter element comprising interdigitated input electrodes and output electrodes located on a top surface of a piezoelectric layer, and a resonator comprising a resonator top electrode on the top surface of the piezoelectric layer and a resonator bottom electrode on the bottom surface of the piezoelectric layer. The resonator is electrically connected in series to the acoustic wave filter element. The resonator has a notch in resonator impedance at a first frequency that lies outside a passband of the acoustic wave filter element.

The resonator can include a mass loading layer on the resonator top electrode, wherein a thickness of the mass loading layer affects a change in the first frequency. The resonator can be electrically connected to the acoustic wave filter element by an electrical connection between the resonator top surface and one of the input and output electrodes of the acoustic wave filter element.

The subject matter described in this specification can be implemented in particular embodiments so as to realize one or more of the following advantages. The embodiments described herein improve the overall/wideband/stop-band response of acoustic band pass filters, e.g., LBAW filters, by suppressing parasitic sidebands. The suppression can be made in particular frequencies or over a range of frequencies. In addition, LBAW filters described herein can be simpler to fabricate because they use only a single piezoelectric layer as compared to two in vertically stacked bulk acoustic wave (BAW) coupled resonator filters. They can also operate at higher frequencies as surface acoustic wave (SAW) filters as their operation is determined more by piezoelectric layer thickness than interdigital transducer (IDT) electrode dimensions. In some embodiments, LBAW filters can also achieve a wider bandwidth than BAW filters. LBAW filters can perform as filters with a single lithographic patterning step as compared to close to 10 in BAW and can operate without reflectors needed in SAW, and thus in smaller size.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 6A-B are schematic cross-sectional and planar views respectively of a circuit including an LBAW connected to acoustic resonator structures.

FIG. 6C is a circuit diagram of the circuit in FIGS. 6A-B.

Like reference numbers and designations in the various drawings indicate like elements.

DETAILED DESCRIPTION

Figure 1A:
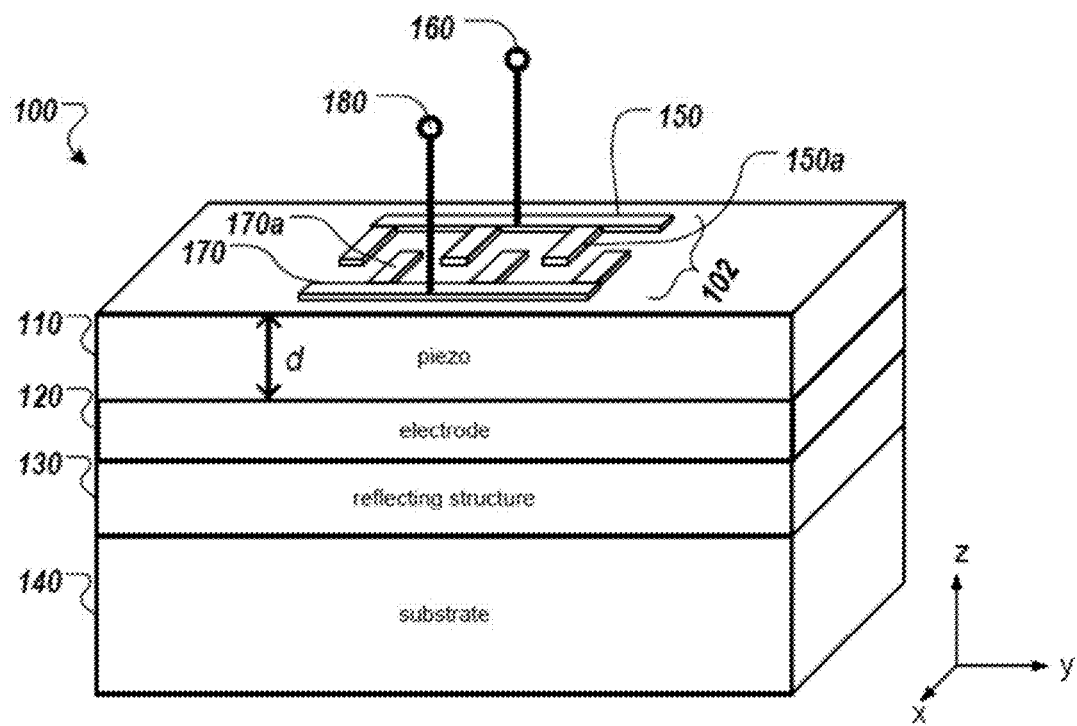
FIG. 1A is a schematic perspective view of a solidly-mounted LBAW filter.
Figure 1B:
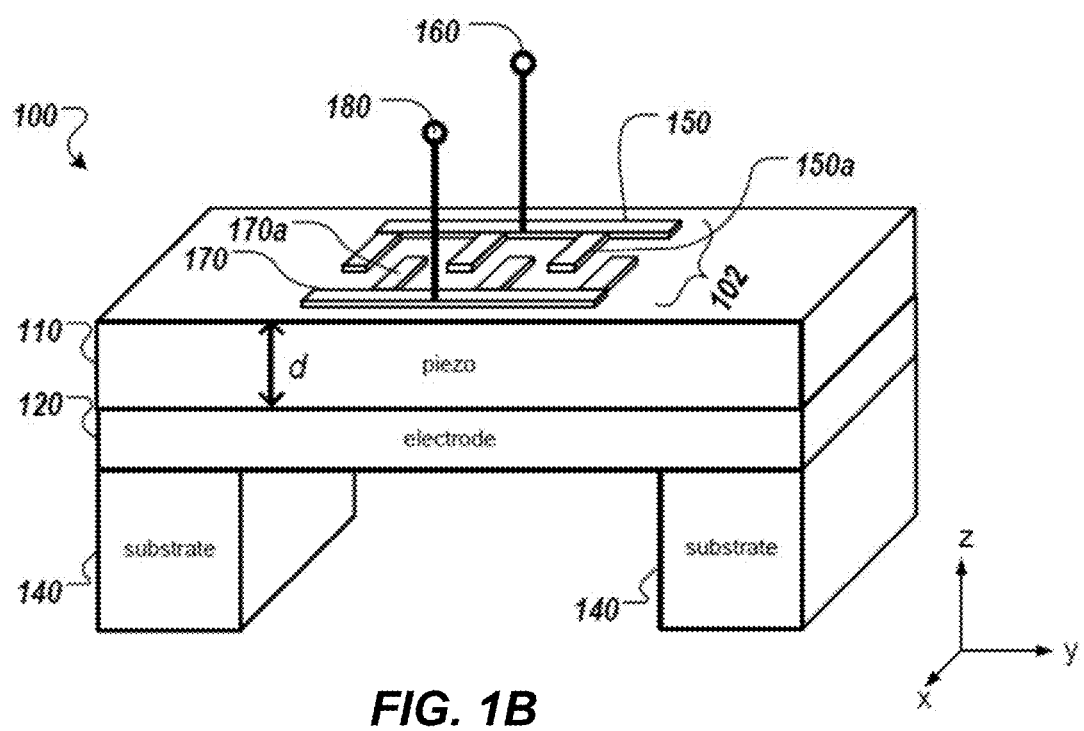
FIG. 1B is a schematic perspective view of a self-supported LBAW filter.
Figure 1C:
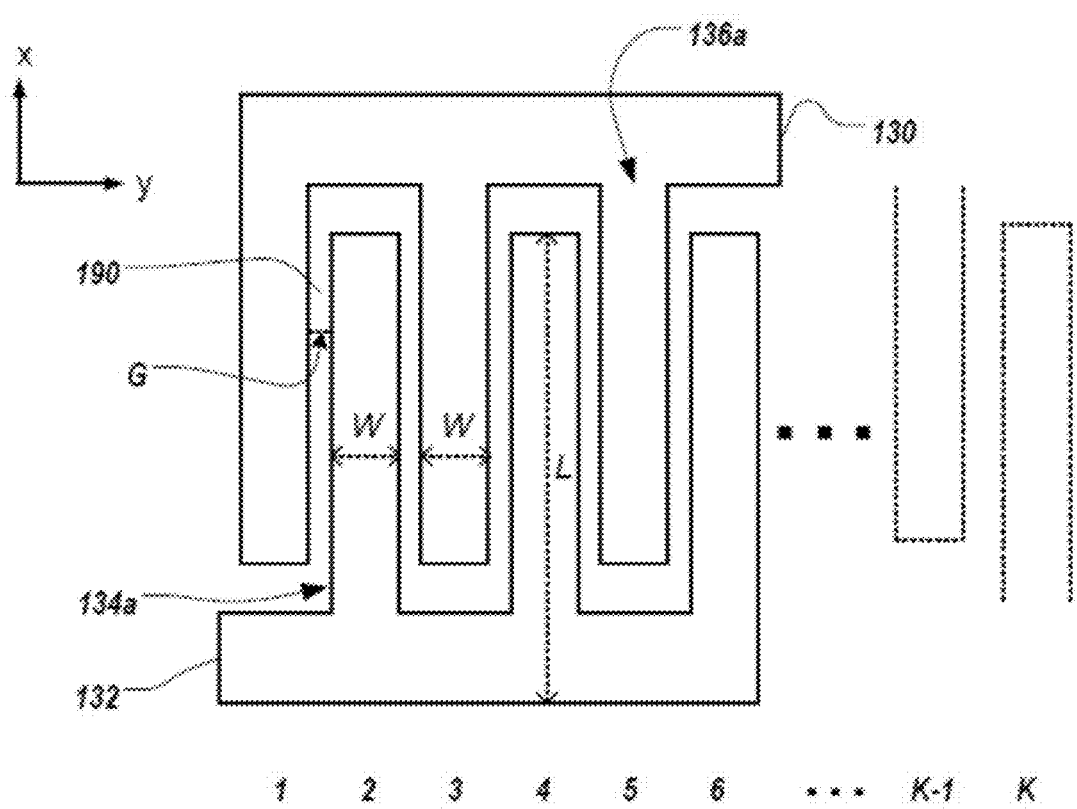
FIG. 1C is a schematic planar view of an interdigital transducer ("IDT") electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150a and 170a, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can couple mechanically across gap 190 from the piezo region under electrode 150 to piezo region under electrode 170 and create a similar standing wave in piezo layer 110 under electrode 170. The standing wave under electrode 170 results in an output signal voltage with the same frequency at an output port 180 via the inverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter.

A reflecting structure 130 can serve to isolate the vibration in piezo layer 110 from an underlying substrate 140 and to prevent acoustic leakage. Thin layer structure can, for example, be a Bragg reflector composed of alternating high and low acoustic impedance ("$Z_{ac}$") material layers. In some embodiments, the thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150a and 170a are rectangular and have a width W, length L, and are spaced by gap width G. Each electrode 150 and 170 has one or more extensions 150a and 170a respectively. The total number of electrode extensions is designated as K.

Although FIG. 1C shows rectangular interdigital electrodes 150/170 with parallel extensions 150a/170a of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling and to provide impedance matching. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, LiNbO$_3$, LiTaO$_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material includes Al, Mo, Pt, Cu, Au, Ag, Ti, W, Ir, Ru, or multilayers of metals and/or metals doped with additional materials, e.g. AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g. AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: Tungsten (W), SiO$_2$, silicon (Si), carbon (C). For example, layers of high acoustic impedance include be W, Mo, Ir, Al$_2$O$_3$, diamond, Pt, AN, Si$_3$N$_4$. Layers of low acoustic impedance can include SiO$_2$, glass, Al, Ti, C, polymers, or porous materials. Layer of Si provides an intermediate acoustic impedance. Various materials are suitable for the substrate 140, such as Si or SiO$_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to achieve a desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
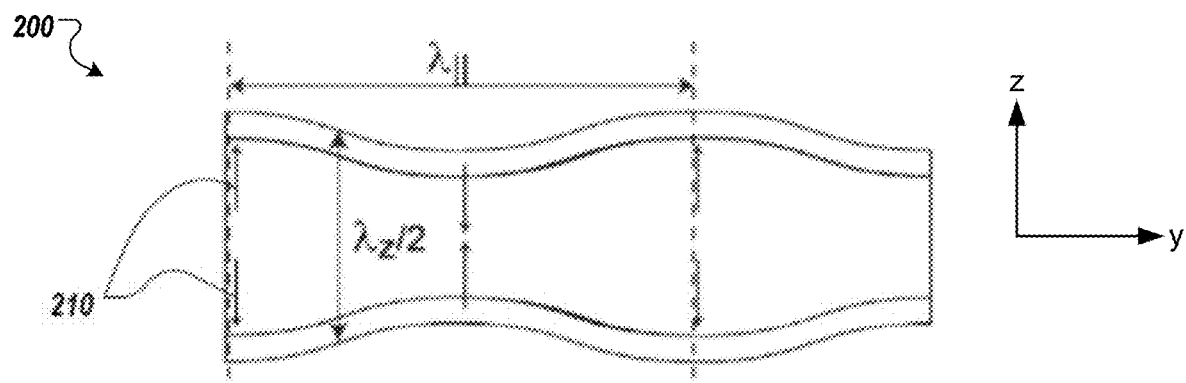
FIGS. 2A-B are schematic diagrams of two types of propagating plate wave modes in LBAW piezo layer.
Figure 2B:
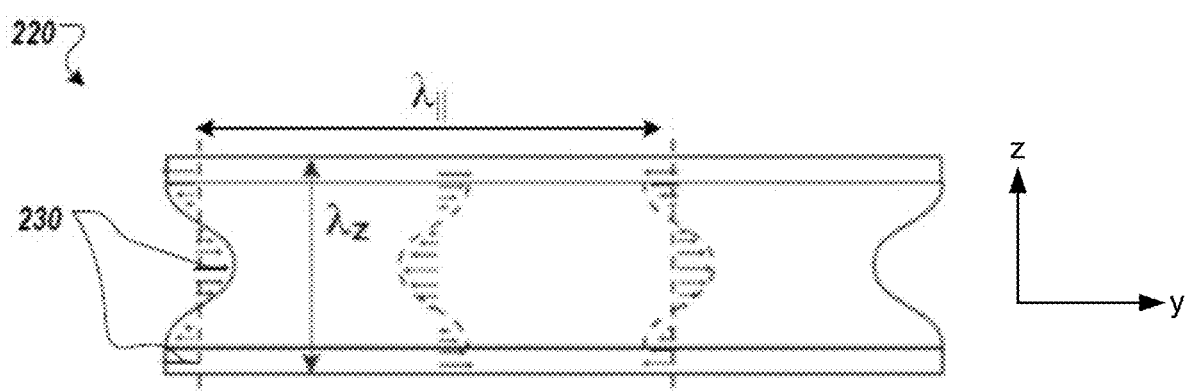

In piezoelectric layer 110, different bulk acoustic vibration modes can arise at different excitation frequencies $f$ of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to half wavelengths $\lambda_z$ (disregarding the thickness of electrodes 150/170); in other words, when d=$N\lambda_z/2$, the lowest resonance occurs when N=1 and higher harmonics follow where N is an integer greater than one. N indicates the order of the resonance. For the TE1 mode, d=$\lambda_z/2$. As discussed further below, the width W of the electrodes and the gap G between electrodes can be designed such that TE1 mode standing waves with certain lateral wavelengths $\lambda_\parallel$ are formed that can couple through their evanescent tails across gap G to create two mechanical resonant modes.

Figure 3:
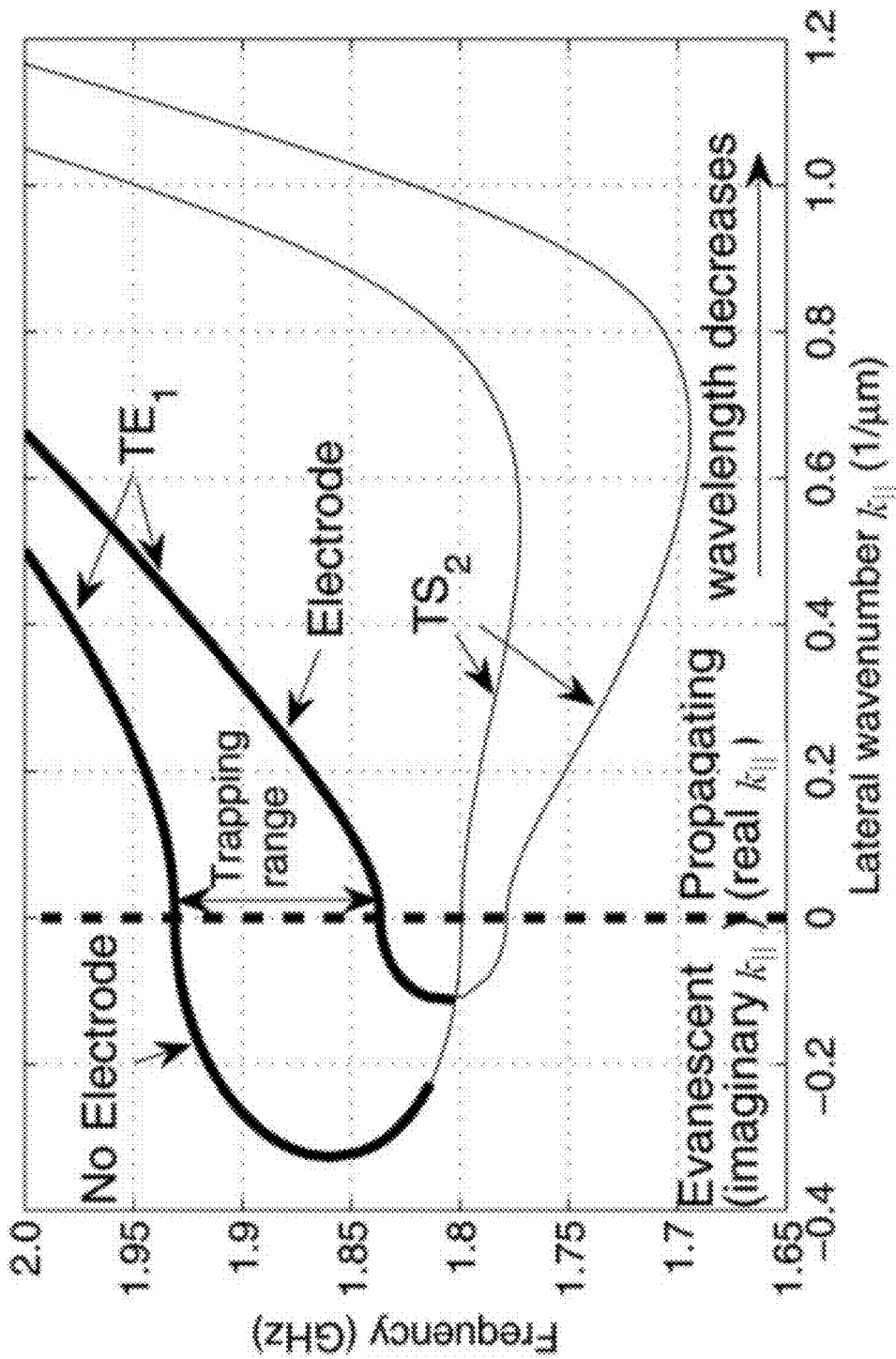
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_\parallel$ of the vibration, where $k_\parallel=2\pi/\lambda_\parallel$, as a function of voltage input frequency $f$. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and one acoustic wavelength A is contained in the combined piezoelectric layer thickness d and the thickness of electrode(s) 150 and 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects $k_\parallel=0$, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with WO lines shows the modes where approximately $\lambda_z/2$ is contained in the combined thickness of the bottom electrode only and the piezolayer. This type of dispersion, in which the TE1 mode has increasing $k_\parallel$ with increasing frequency $f$, is called Type 1. The difference in intersect $k_\parallel=0$ WO frequencies between electrode and non-electrode areas determines the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 100 materials can be selected in which Type 1 dispersion can occur. For example, ZnO can be used. In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\parallel$ with increasing frequency $f$, and then increasing with increasing frequency $f$, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of denote real wave numbers (propagating waves) and negative $k_\parallel$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, $k_\parallel$ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode, and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
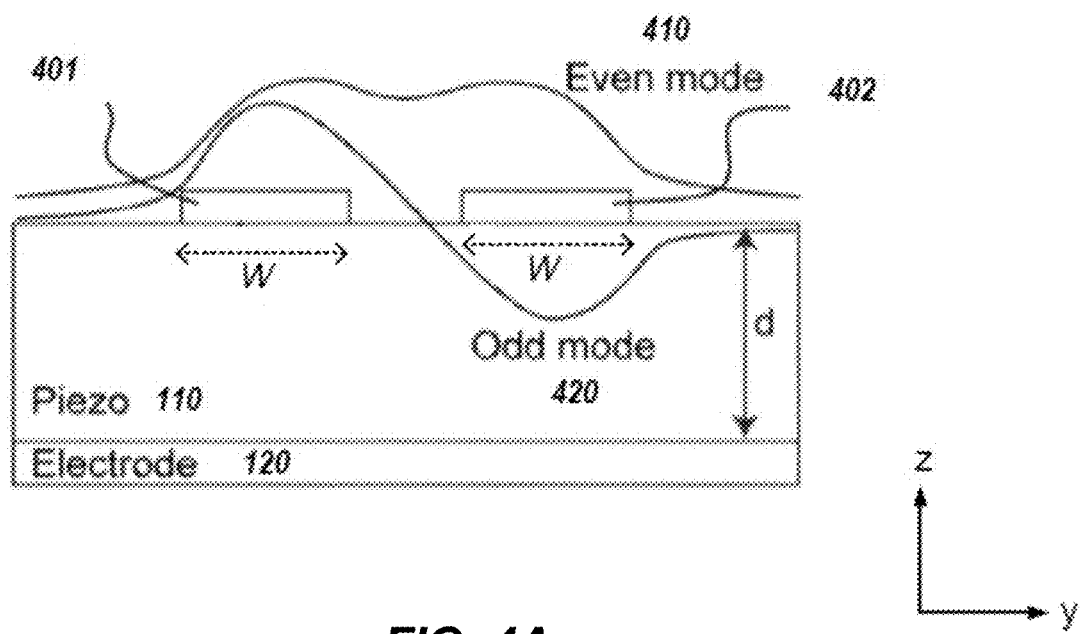
FIG. 4A is a schematic diagram of two resonant modes in an LBAW.
Figure 4B:
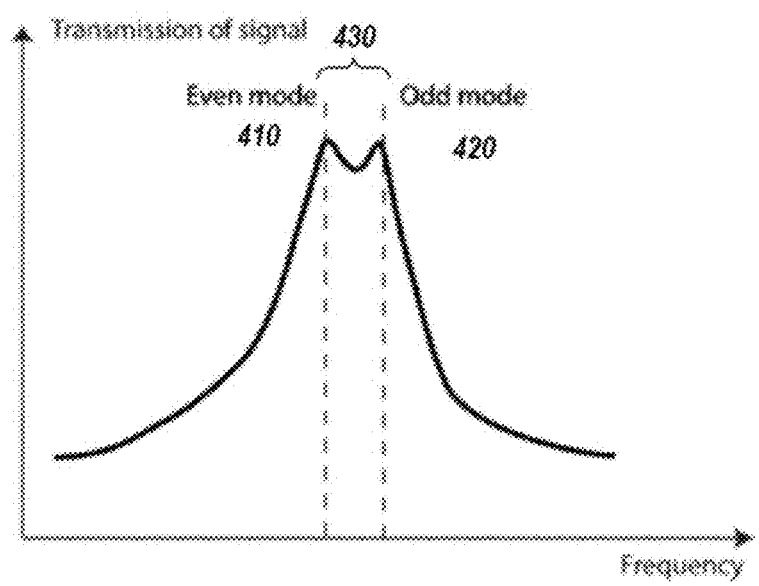
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 150a and 170a of respective electrodes 150 and 170 of FIG. 1A). The bandpass frequency response of LBAW 100 is formed by two (or more) laterally standing resonance modes, 410 and 420, arising in the structure. Lateral standing wave resonance can arise when plate waves are reflected from edges of electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4W and in case of a large gap $\lambda_{even}$ gets close to 2W. The odd lateral standing wave resonance can arise when the width of the electrode is roughly equal to half of the lateral wavelength $\lambda_\parallel$ of the mode:

$$\frac{\lambda_{off}}{2} = \frac{\lambda_\parallel}{2} \approx W.$$

Referring to FIG. 4B, the even 410 and odd 420 modes are shown as transmission peaks as a function of input frequency $f$ for an LBAW with Type 1 dispersion. For Type 1 dispersion, even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0(f_{symm}+f_{asymm})/2$ is the center frequency between the two modes.

In some embodiments, increasing the number of extensions (e.g., 150a and 170a) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W+K·G can be such that the highest-order mode trapped in the structure is the desired odd mode resonance. For example, K can be 31, W can be 3 μm and G can be 2 μm.

In some embodiments, the number of electrode extensions K is between 2 and 200, or between 10 and 60. In some embodiments, the length L of electrode extensions can be between 50 μm and 2000 or between 70 μm and 500 μm.

In some embodiments, the gap G is selected to allow coupling of the evanescent tails of standing waves formed under electrodes 150 and 170. For example, the gap G between electrode extensions can be 0.1 μm and 10 or between 2 μm and 5 μm.

In some embodiments, electrode 150 and 170 topology can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e. the length at which amplitude $A=A_0 \cdot ^{-1}$ of the original amplitude $A_o$, in the gap at the desired even resonance mode. Gap with G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from finger to finger causing poor out of band attenuation.

In some embodiments, gap width G can be defined with respect to piezo layer thickness d. For example, G can be designed to be 10% to 300% of d, or 25% to 150% of d.

In some embodiments, the width of electrode extensions W can be between 0.1 μm and 30 μm or between 2 μm and 5 μm. In some embodiments, W can be designed such that the wavelength $\lambda_\parallel$ of the lateral acoustic wave at the desired odd mode resonance frequency $\lambda_{odd}$ is obtained.

In some embodiments, electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel = \lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material (A) at the operation frequency $f$. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thickness are selected, the geometry of the electrode extensions 150a and 170a, such as number K, width W, gap G, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 2% to 25% of d, or 3% to 15% of d.

In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength A in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_\parallel=0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the $k_\parallel=0$ frequency of the outside region's TS2 mode can be 95%-99% of the electrode region's TE1 cutoff frequency. The frequency difference between the outside region's TS2 and outside region's TE1 modes' $k_\parallel=0$ frequencies is designed to be large, e.g. 5%-15%, for example 6.5%-7.5%, of the electrode region's TE1 mode cutoff frequency.

According to certain embodiments of the present invention, the $k_\parallel=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_\parallel=0$ frequencies:

$$\frac{electrode\ TE1 - outside\ TS2}{outside\ TS2}$$

should be small, for example on the order of 1%. As an example, said frequency distance can be between 0.2% and 2.1%, or between 0.5% and 1.8%, or between 0.8% and 1.5%, or for example, 1.1%.

Figure 5:
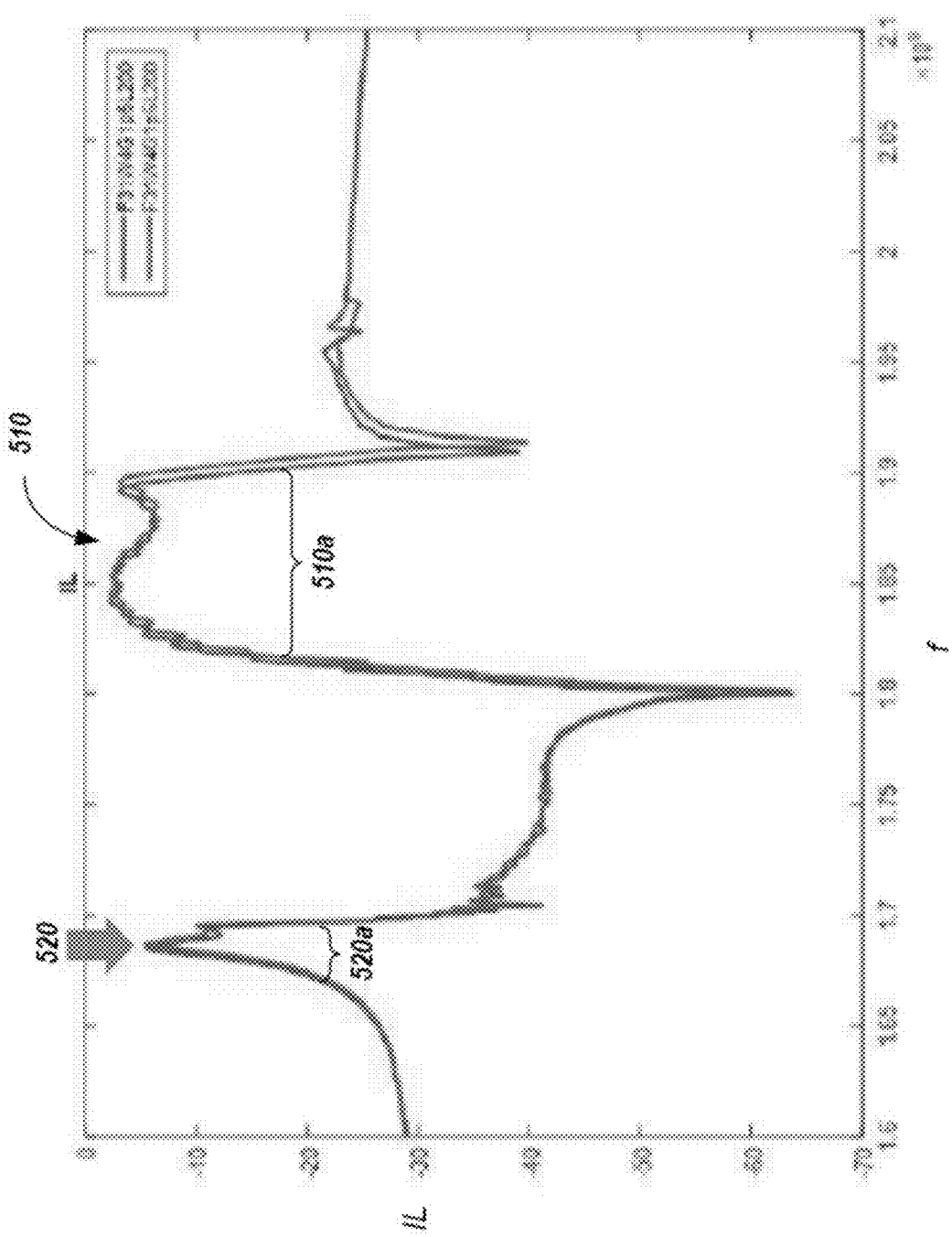
FIG. 5 is an experimental transmission curve of an LBAW as a function of frequency.

FIG. 5 shows a curve of insertion loss IL (in decibels) versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520a (also referred to herein as "TS2 passband"), and the TE1 modes correspond to passband 510a (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510a of 0.5-15% relative to center frequency, e.g., 10% relative to center frequency, or 5%, or 2%, or 1%. In some embodiments, the insertion loss at the passband is better than −7 dB, e.g., −7 dB to −0.5 dB or −5 dB to −0.5 dB.

LBAWs can be used as bandpass filters. The IDT electrodes of an LBAW can be designed to couple a driving electrical signal to a desired fundamental TE1 mode. An effective coupling results in a passband similar to the TE1 passband of 510a in FIG. 5. However, the coupling also results in one or more sidebands similar to the sideband 520a. The sideband 520a can be at a lower frequency than passband 510a, and can be narrower than the passband 510a. The sideband 520a is generated because of electric field between the parallel extensions (e.g., the extensions 150a and 170a) of LBAW. The extensions cause an asymmetrical electric field in the thickness direction of the piezo, and the asymmetrical electric field couples to both the TE1 and TS2 modes.

Implementations of the present disclosure provide techniques to suppress LBAW sidebands created by TS2 modes. The implementations suppress the sidebands by connecting acoustic resonators to the LBAW. At least one of the acoustic resonators has an impedance notch at a resonance frequency within the bandwidth of the sideband. As explained in further details below, the impedance notch causes an increase in insertion loss of the LBAW at the resonance frequency, and results in an overall increase of the insertion loss in the sideband.

The acoustic resonators can be added in series or in parallel with LBAW 100. For example, referring to FIGS. 6A-B, cross-sectional and planar views of structure 600 include LBAW 100 connected to resonators 612, 613, 615, and 616. FIG. 6C shows the corresponding circuit diagram of structure 600. In structure 600, piezo layer 110 is common to LBAW 100 and all connected filters. Moving from left to right of FIG. 6B, parallel resonator 612 and series resonator 613 are located before input port 160 of LBAW 100. Series resonator 615 and parallel resonator 616 are located after output port 180 of LBAW 100. In parallel resonators 612, 616, the lower electrode is grounded. In series resonators 613, 615, the signal goes to the lower non-grounded electrode across piezo layer 110.

Embodiments with one or more series resonators can be designed so that resonance frequencies of the series resonators fall within passband frequencies of the sideband, and suppress the sideband. An acoustic resonator (e.g., a BAW/FBAR resonator) has a very high impedance at its anti-resonance frequency. Such high impedance prevents the driving electrical signal to pass through and reduces signal transmission though the filter. Thus, a resonator with one or more anti-resonance frequencies within sideband of an LBAW filter can be added in series to the LBAW filter to reduce signal transmission and suppress LBAW's sideband.

Embodiments with one or more parallel resonators can be designed so that resonance frequencies of the parallel resonators fall within passband frequencies of the sideband, and suppress the sideband. An acoustic resonator (e.g., a BAW/FBAR resonator) has a very low impedance at its resonance frequency. Such low impedance shunts the driving electrical signal to ground and reduces signal transmission though the filter. Thus, a resonator with one or more resonance frequencies within sideband of an LBAW filter can be added in parallel to the LBAW filter to reduce signal transmission at the one or more resonance frequencies and suppress LBAW's sideband. In general, one or more parallel resonators can be integrated to an LBAW filter by (i) using input or output electrodes of the LBAW as parallel resonators, and/or by (ii) connecting the one or more parallel resonators to the LBAW filter.

The resonance frequency and anti-resonance frequency of a resonator can be tuned by adjusting the mass loading of the resonator. The mass loading can be achieved by applying one or more mass loading layers on one or both electrodes of the resonator. The mass loading layer can be composed of a different from or the same material as the underlying electrode. In the latter case, the two resonators can be considered to have electrodes of different thickness.

Different mass loading between two resonators can be achieved by i) applying a mass loading layer on an electrode of one resonator but not on the electrode of the other resonator, ii) applying different thicknesses of the same (or different) material(s) on the two respective electrodes of the two resonators, and/or iii) by applying layers of different materials on the two respective electrodes of the two resonators. In addition, different mass loading between two resonators can be achieved by having the electrodes of the two resonators have different thicknesses.

Between two resonators with mass loading layers composed of the same material, the resonator with a thicker mass loading layer has a greater mass and thus a lower anti-resonance frequency than the resonator with a thinner electrode. Thus, the anti-resonance frequency can be adjusted by adding or removing loads on top of the resonator's electrode.

Series resonators (i.e., resonators in series with an LBAW) can be designed to have anti-resonance frequencies within the frequency range of one or more sidebands that are to be suppressed (e.g., the frequency range of sideband 520a). Moreover, multiple series resonators with different anti-resonance frequencies can be designed to suppress a sideband over a wider range of frequencies (as compared to series resonators with the same resonance frequency), or to suppress multiple sidebands.

FIGS. 7A-9B illustrate example band pass filters including acoustic resonators in series with LBAW 100. FIGS.

7A-7B, 8A-8B, and 9A-9B illustrate top views and cross-sectional views of band pass filters 700, 710, and 720, respectively. Filters 700, 710, and 720 can generally be the same, except that they may differ in one or more mass loading layers in one or more of their series resonators (also referred to herein as "resonators"). The filters 700, 710, 720 can be generally the same as the filter assembly 600, except as described. For example, the filters 700, 710, 720 can optionally omit the parallel resonators 612, 616, although such parallel resonators could still be included between the LBAW filter.

Filter 700 includes series resonators 702, 704 in series with the LBAW filter 100, filter 710 includes series resonators 702, 712 in series with the LBAW filter 100, and filter 720 includes series resonators 722, 724 in series with the LBAW filter 100. Each of resonators 702, 704, 712, 722, 724 has a top electrode and a bottom electrode that sandwich the piezoelectric layer 110. The top electrodes can serve as the output electrodes for the filter 700, 710, 720. The resonators 702, 704, 712, 722, 724 and the LBAW 100 can share a common piezo layer 110.

The LBAW filter 100 includes the IDT 102 with input electrode 150 having extensions 152 from a common input electrode 154 and an output electrode 170 having extensions 172 from a common output electrode 174. A counter electrode 120 can be positioned on the underside of the piezoelectric layer in the same area as the extensions 152 and/or 172. Thus in the LBAW 100, the piezoelectric layer 110 is sandwiched between the extensions 150 and the counter electrode 120. The counter electrode 120 can be grounded. Although the outer edges of the counter-electrode 120 are illustrated as aligned with the inner edges of common electrodes 154, 174, this is not required. For example, the counter electrode 120 could extend partially under the common electrodes 154, 174 in which case they form parallel resonators, or stop short of the common electrodes 154, 174.

Figure 7A:
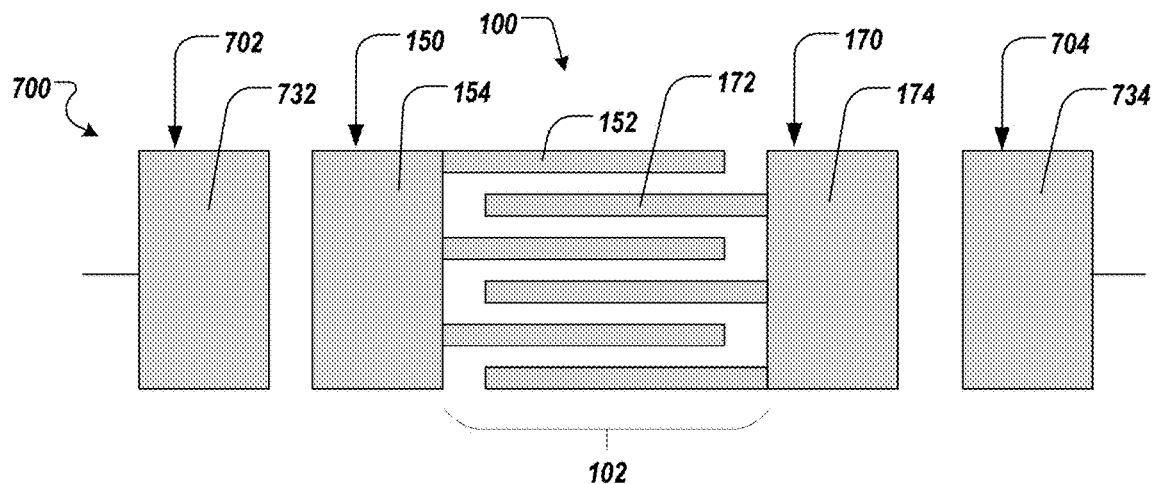
FIGS. 7A and 7B illustrate top and side views, respectively, of a first example band pass filter including acoustic resonators in series with an LBAW filter.
Figure 7B:
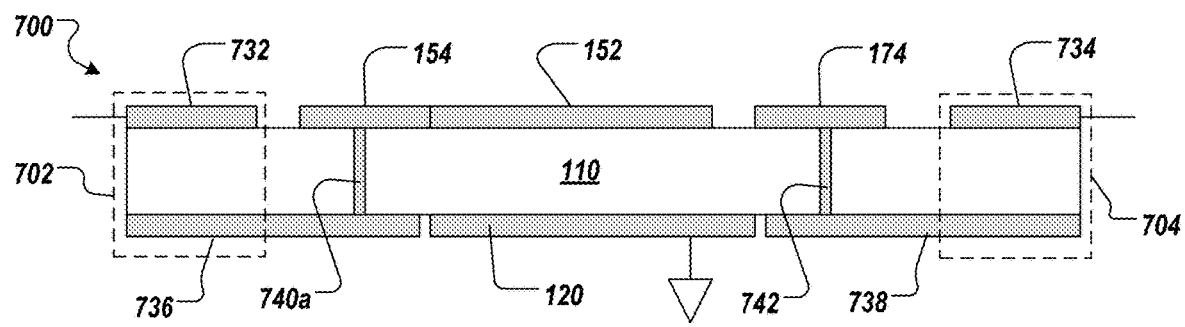
Figure 7C:
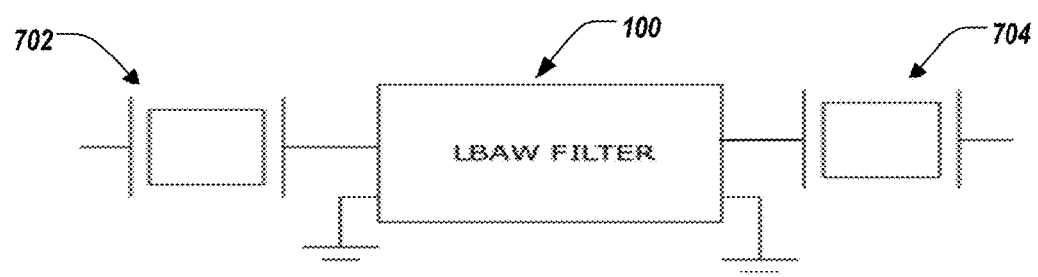
FIG. 7C illustrates connections between the components of the band pass filter of FIGS. 7A-7B.

Referring to FIGS. 7A, 7B, and 7C, the filter 700 includes two series resonators 702, 704 that are coupled to the input and output electrodes 150, 170, respectively, of the LBAW 100. In particular, each series resonator 702, 704 includes a respective conductive layer 732, 734 as a top electrode, and a respective conductive layer 736, 738 as a bottom electrode. In the series resonator 702, the piezo layer 110 is sandwiched between the conductive layers 732, 736, and in the series resonator 704 the piezo layer 110 is sandwiched between the conductive layers 734, 738.

Each bottom electrode is electrically coupled to the respective input and output electrodes 150, 170. The conductive layers 736, 738 can be electrically connected to the common electrodes 154, 174, respectively. In particular, conductive vias can be formed through the piezo layer 110 to connect the input and output electrodes of the LBAW 100 to the bottom electrodes. For example, a conductive via 740a formed through the piezo layer 110 can connect the common electrode 154 to the conductive layer 736. Similarly, a conductive via 742 formed through the piezo layer 110 can connect the common electrode 174 to the conductive layer 738.

Figure 7D:
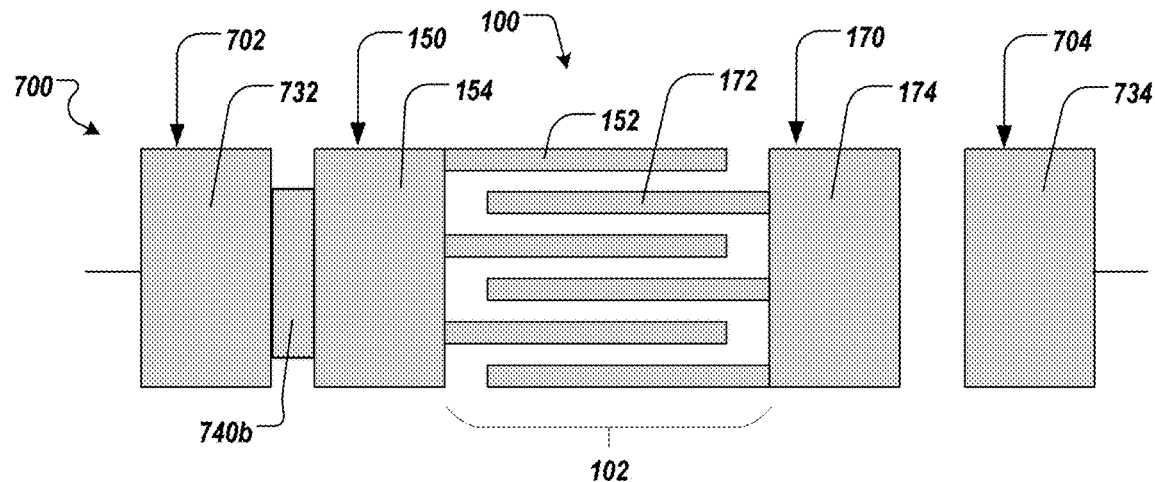
FIGS. 7D and 7E illustrate top and side views, respectively, of a second example band pass filter including acoustic resonators in series with an LBAW filter.
Figure 7E:
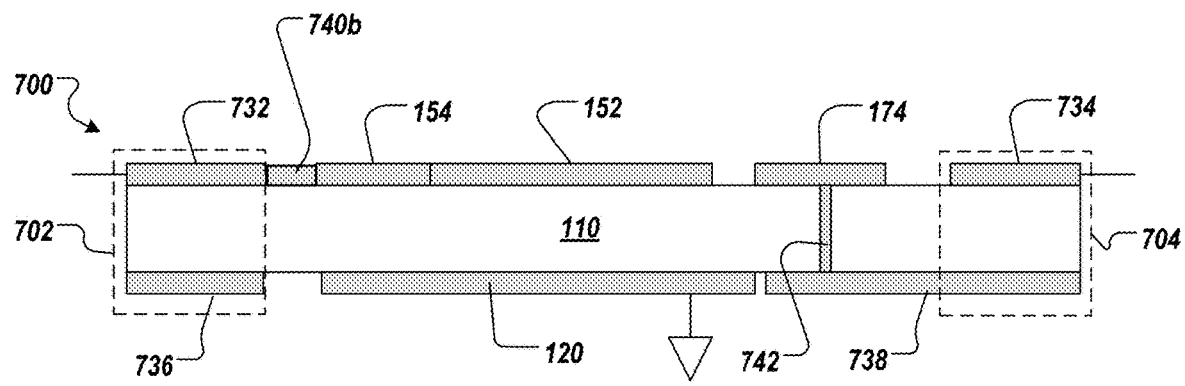
Figure 7F:
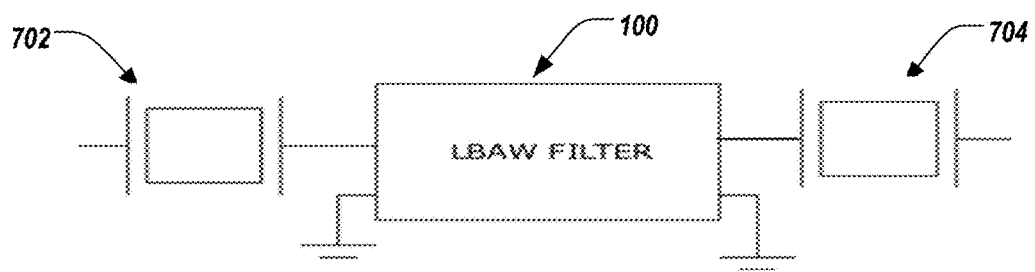
FIG. 7F illustrates connections between the components of the band pass filter of FIGS. 7D-7E.

FIGS. 7D through 7F are similar to FIGS. 7A through 7C, except that the LBAW 100 is connected to the series resonator 702 through the conductive connector 740b and the counter electrode 120 extends under the extension 154. The connector 740b electrically connects the common electrode 154 of the LBAW 100 to the conductive layer 732 of the series resonator 702.

Figure 7G:
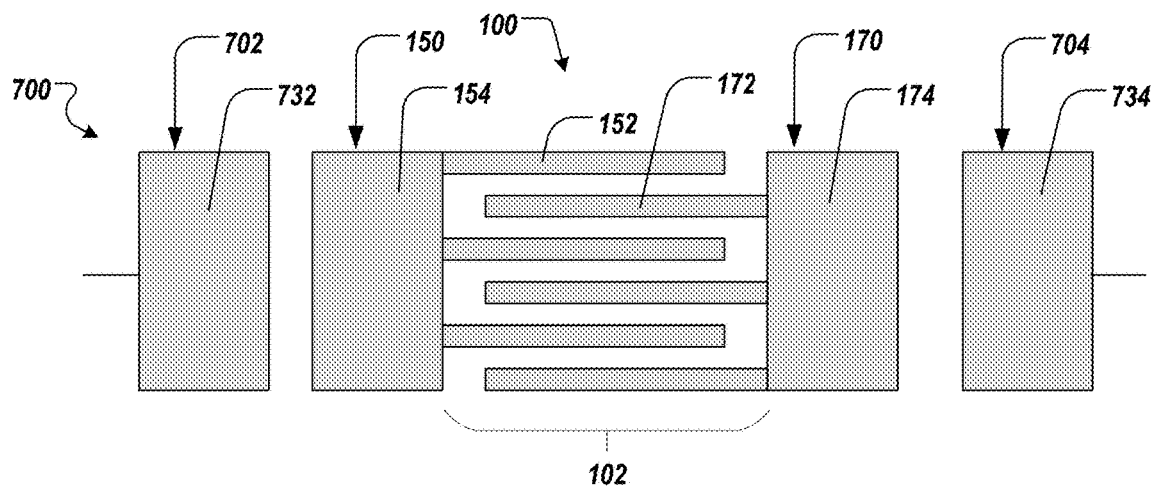
FIGS. 7G and 7H illustrate top and side views, respectively, of a third example band pass filter including acoustic resonators in series with an LBAW filter.
Figure 7H:
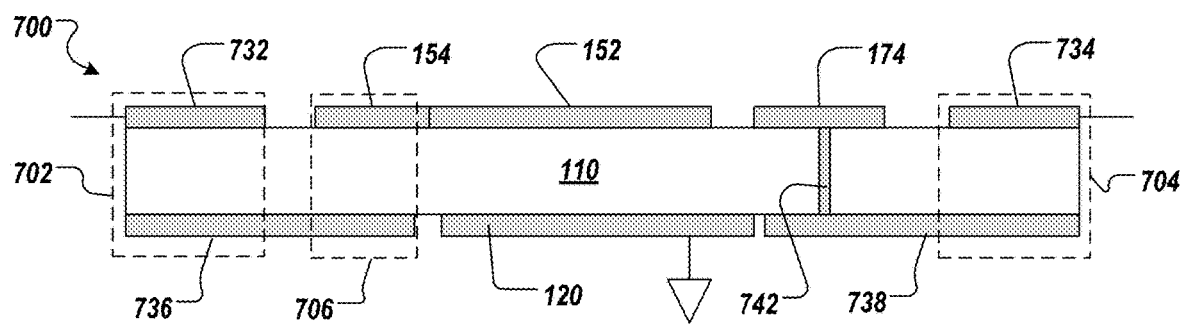
Figure 7I:
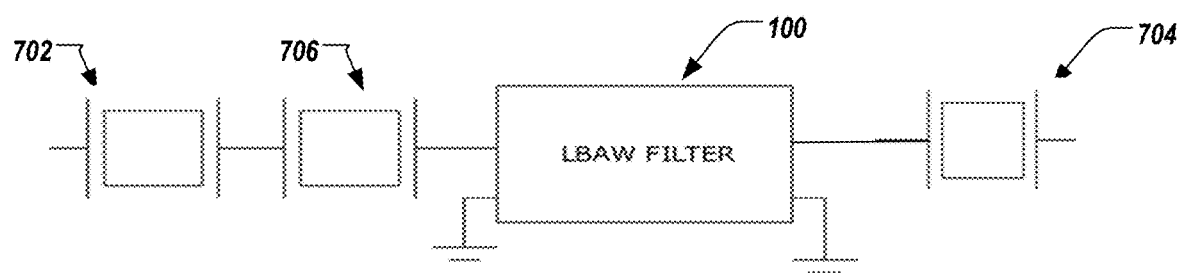
FIG. 7I illustrates connections between the components of the band pass filter of FIGS. 7G-7H.

FIGS. 7G through 7I are similar to FIGS. 7A through 7C, except that the LBAW 100 is electrically connected to a series resonator 706, which is electrically connected to the series resonator 702. The series resonator is formed by the piezo layer 110 sandwiched between at least part of the extension 154 and at least part of the bottom conductive layer 736. The series resonator 706 is electrically connected with the series resonator 702, for example, through the conductive layer 736.

As previously explained, anti-resonance frequency of either or both series resonators 702 and 704 (in any of the examples depicted in FIGS. 7A-7I) can be tuned by adding mass loads to, or removing mass loads from the respective conductive layers 732, 734. To reduce anti-resonance frequency of resonator 702, 704, a layer that provides a mass load can be deposited on top of the conductive layer 732, 734 of the respective resonator. To increase anti-resonance frequency of resonator 702, 704, the conductive layer 732, 734 of the respective resonator can be partly removed, i.e., thinned, for example, through etching or by fabricating them to have a smaller thickness.

Figure 8A:
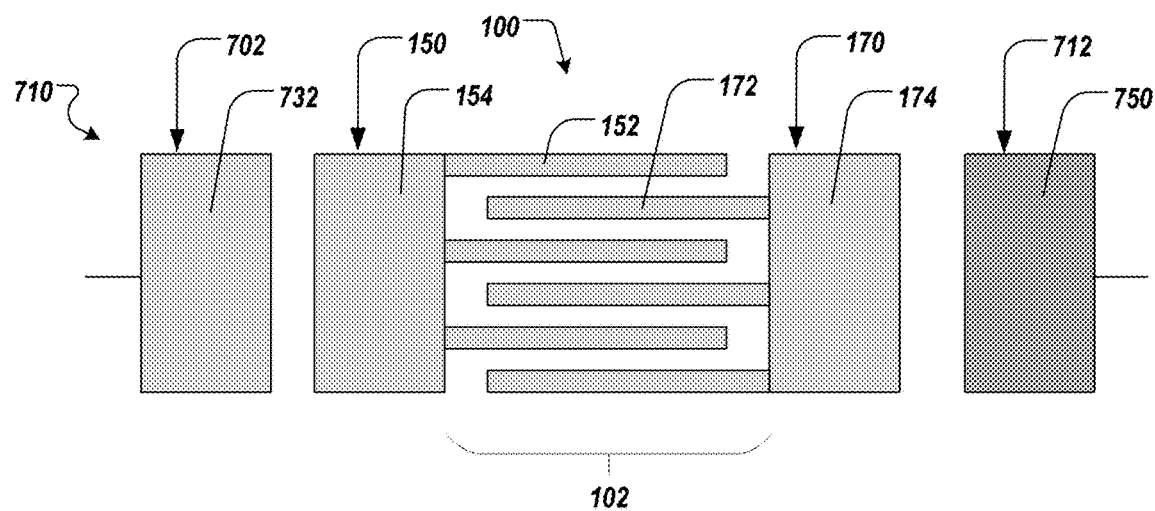
FIGS. 8A and 8B illustrate top and side views, respectively, of an example band pass filter including acoustic resonators with different mass loadings in series with an LBAW filter.
Figure 8B:
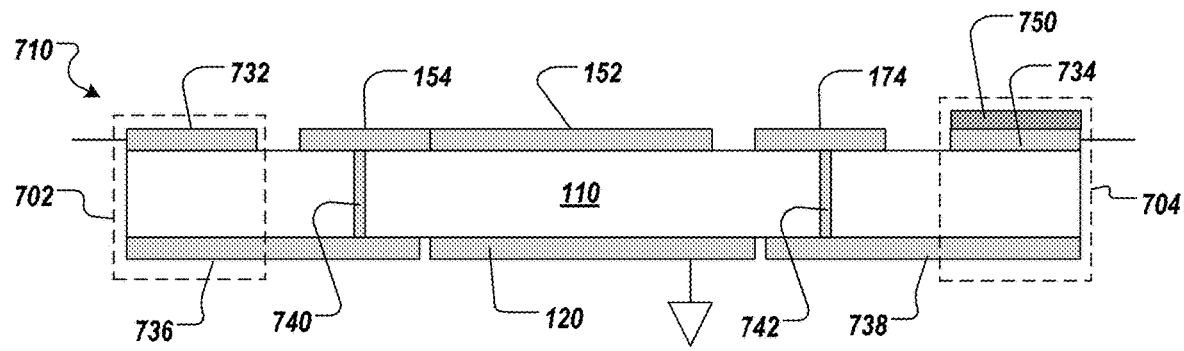

FIGS. 8A and 8B illustrate a band pass filter 710 with a series resonator 702 and a series resonator 712. In particular, the mass loading of the two resonators 702, 712 is different such that the two resonators 702, 704 have different anti-resonant frequencies. Both anti-resonant frequencies can be within the frequency range of the sideband 520 of LBAW 100.

The series resonator 712 is formed by adding a mass loading layer 750 on top of the conductive layer 734 (or top electrode) of the resonator 704. In some embodiments the conductive layer 734 is composed of Aluminum (Al), Copper (Cu), or polysilicon (poly-Si) and the layer 750 is composed of silicon oxide ($SiO_2$) and/or silicon nitride (SiN). Due to the addition of the mass loading layer 750, resonator 712 can have a lower anti-resonance frequency than the resonator 704.

The thickness of the mass loading layer 750 can be selected to provide a desired anti-resonance frequency for the resonator 712. For example, if the anti-resonance frequency of resonator 704 would otherwise be higher or lower than the frequency range of the sideband 520a, the thickness of layer 750 can be selected so that the resonance frequency shifts, to provide an anti-resonance frequency within the sideband 520a for the resonator 712. The thickness can also be adjusted by further thickening (e.g., by depositing more material) or thinning (e.g., by etching) layer 750.

The resonator 702 can have a different thickness than the resonator 712. This thickness difference can result from different thickness of the two conductive layers 732, 734, or from a mass loading layer 750 being present in the resonator 712 and absent in the resonator 702, or from different thicknesses of mass loading layers on the two conductive layers 732, 734. Other options that can result in different thicknesses for the two resonators 702 and 712 are different thicknesses in piezoelectric layer, different thicknesses in any other layers of the two resonators, or different thicknesses of multiple layers of the two resonators.

Resonator 712 can be composed of one or more materials that are not included in resonator 702. For example, the mass loading layer 750 in the top electrode of the resonator 702 may be composed of a material (e.g., silicon oxide, silicon nitride, etc.) different from the material of the conductive layers 732, 734 (e.g., aluminum, copper, etc.).

The mass loading layer 750 can be composed of the same material or different material than the conductive layer 734. For example, the conductor layer 734 can be composed of aluminum (Al), and the mass loading layer 750 can be composed of Al, silicon oxide and/or silicon nitride. Where the mass loading layer 750 is a conductor, e.g., the same conductive material as conductive layer 734, the resonator 712 can be considered to have a thicker electrode than the resonator 702.

Although FIGS. 8A and 8B illustrate achieving different mass loading by including a mass loading layer 708 in resonator 712 and not including a mass loading layer in resonator 702, other techniques are possible. For example, both resonators can include mass loading layers of different thickness and/or material. For example, the mass loading layers of the two resonators 702, 704 can be composed of the same material but different thickness.

As another example, the mass loading layers of the two resonators 702, 704 can be composed of different materials, optionally with the same thickness. Alternatively or in addition, a thickness of the resonator electrode (i.e., the conductor layer 732) of resonator 702 can differ from the thickness of the electrode (i.e., the conductive layer 734) of resonator 712. Alternatively or in addition, the material of the conductor layer 732 can differ from the material of the conductive layer 734 to provide different densities, and thus different mass loading, of the resonators 704 and 702.

As noted previously, multiple resonators with different anti-resonance frequencies within the sideband can be connected to an LBAW in series, to suppress a wider range of frequencies (as compared to a configuration with a single series resonator, or a single anti-resonance frequency) of the LBAW's sideband. Multiple series resonators with different anti-resonance frequencies provide high impedance that prevent the driving electrical signal to pass through and reduces signal transmission through the filter at each of the anti-resonance frequencies. For example, when the two resonators 702 and 712 of filter 710 have different anti-resonance frequencies that fall within sideband frequencies of the LBAW 100 (e.g., sideband 520a), the sideband is suppressed over a wider range of frequencies compared to when the two resonators have the same anti-resonance frequencies.

Figure 9A:
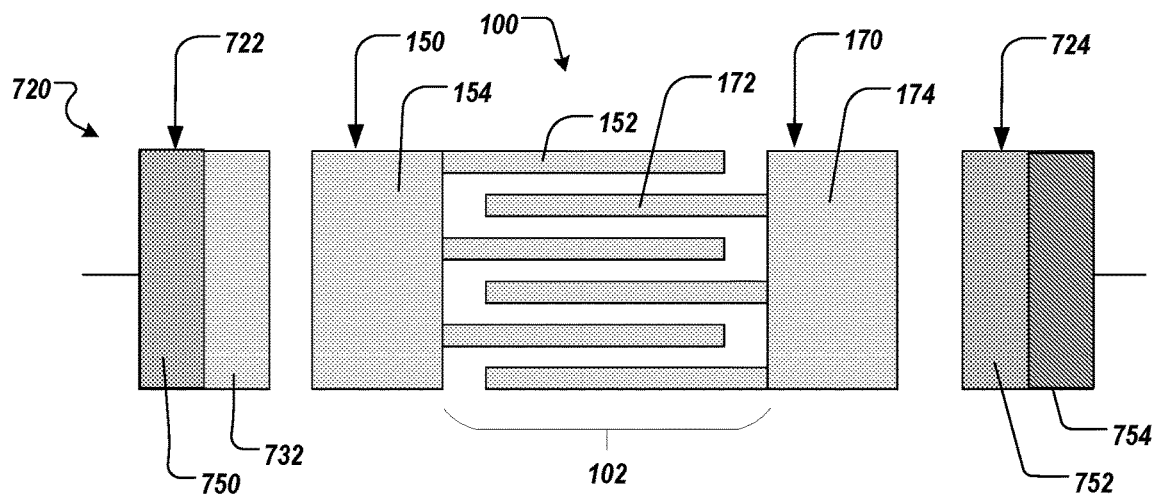
FIGS. 9A and 9B illustrate top and side views, respectively, of another example band pass filter including acoustic resonators with different mass loadings in series with an LBAW filter.
Figure 9B:
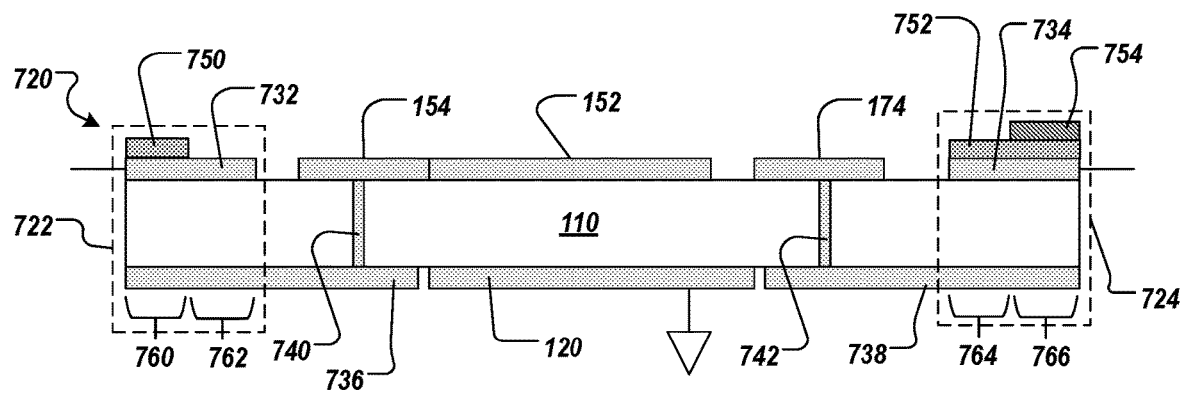
Figure 9C:
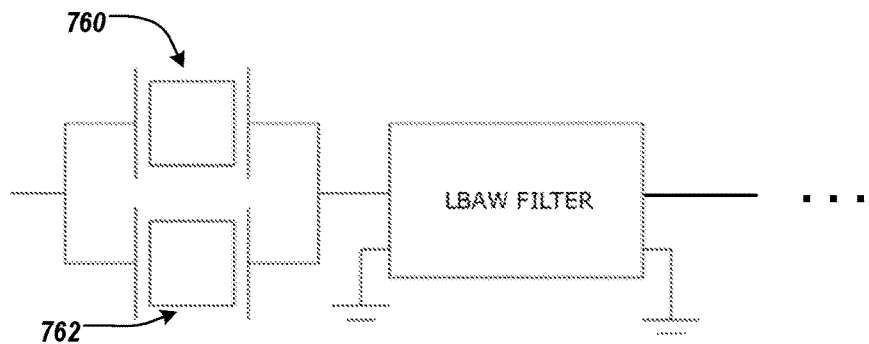
FIG. 9C illustrates connections between some of the components of the band pass filter of FIGS. 9A-9B.

FIGS. 9A-9C depict an example band pass filter 720 with two series resonators 722, 724, in which each series resonator includes multiple regions with different mass loading. For example, the series resonator 722 can include regions 760 and 762 with different first and second mass loadings, and the series resonator 724 can include regions 764 and 776 with different third and fourth mass loadings.

In particular, resonator 722 can include a mass loading layer 750 on top of a first portion 760 of the conductive layer 732, and no mass loading layer on the second portion of 762 of the conductive layer 732. Resonator 724 can include multiple mass loading layers 752 and 754 on top of the conductive layer 734. For example, resonator 724 can include a single mass loading layer 752 on top of a first portion 764 of the conductive layer 734, multiple mass loading layers 752 and 754 on the second portion of 766 of the conductive layer 734.

The layers 750, 752, 754 may be composed of the same or different materials. For example, conductive layer 732, 734 can be composed of aluminum (Al), copper (Cu) or polysilicon, and the mass loading layers 750, 752, 754 can be composed of silicon oxide ($SiO_2$), silicon nitride (SiN) and/or one or more metals. The layers 732, 734, 750, 754, 756 can have different thicknesses. In some examples, the conductive layer 732 may have a different thickness in resonator 722 than in the resonator 724.

Depending on the properties (e.g., thickness, material) of the four regions of the two series resonators 722, 724, the band pass filter 720 may act on the insertion loss as an LBAW in series with two resonators 722 and 724, each including two parallel resonators. As illustrated by FIG. 9C, the two parallel resonators in the resonator 722 are formed by the first portion 760 the second portion 762. The two parallel resonators in the series resonator 724 are formed by the third portion 764 and the fourth portion 766.

Each of the layers 732, 734, 750, 752, 754 of FIGS. 7A-9B can be made of the same or different materials as the LBAW extensions (e.g., extensions 150a or 170a). In some embodiments electrodes 732, 734 and/or LBAW extensions are composed of Aluminum (Al), and the layers 750, 752, 754 are composed of silicon oxide ($SiO_2$) and/or silicon nitride (SiN). For example, layer 750 can be composed of $SiO_2$ and layer 752 can be composed of SiN. In some examples, a layer composed of $SiO_2$ is less than 500 nm thick, and a layer composed of SiN is less than 100 nm thick. In some examples, a layer composed of $SiO_2$ is 50 to 250 nm thick, and a layer composed of SiN is 5-50 nm thick.

In some embodiments, one or more resonator electrodes are the uppermost layers of the respective resonators. For example, layer 750 may be used as an electrode of the resonator 712.

The anti-resonance frequency of a resonator can also be tuned by adjusting lateral shape of the resonator. Larger resonators (e.g., resonators with large electrode surfaces) have lower resistance at their anti-resonance frequencies, and block a smaller portion of the driving electrical signal. Thus, to have a strong blockage, a small resonator can be a desirable resonator for suppressing LBAW sideband.

If a resonator's width (e.g., a resonator electrode's width) is narrower than a threshold width, its anti-resonance frequency starts to depend on the resonator's width. For such narrow resonators, the anti-resonance frequency depends on the width of the resonator, and the narrower the resonator is, the higher its anti-resonance frequency gets (assuming Type 1 dispersion, i.e. frequency increasing with decreasing lateral wavelength). A resonator can be of any shape, such as circular, rectangular, doughnut, etc. The size and shape of the resonator can be adjusted to produce a spectrum of closely spaced resonances in such a way that a wide band suppression is achieved. For example, an electrode of a resonator can be in form of a doughnut and form a parallel resonator in doughnut shape. Impedance of a narrow doughnut resonator can peak at more than one resonance frequency, resulting in suppression of insertion loss over a wider range of frequencies compared to single resonance frequency resonators (e.g., a rectangular resonator). It should be noted that in deciding the form of a resonator, both resonance frequency and resistance of the resonator at the anti-resonance frequency should be considered. For example, compared to a rectangular resonator a doughnut resonator may have multiple resonance frequencies but lower resistance at each anti-resonance frequency, resulting in a milder blocking effect at the anti-resonance frequencies.

Figure 10A:
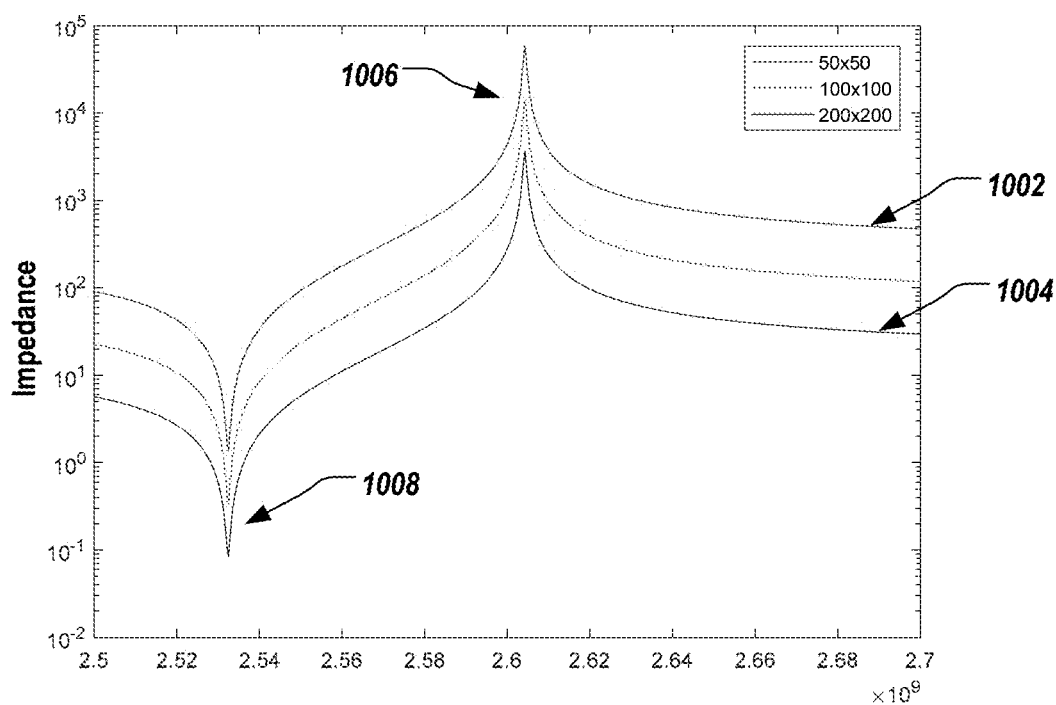
FIGS. 10A and 10B illustrate an example effect of size of a resonator on the resonator's impedance and resistance at resonance and anti-resonance frequencies.
Figure 10B:
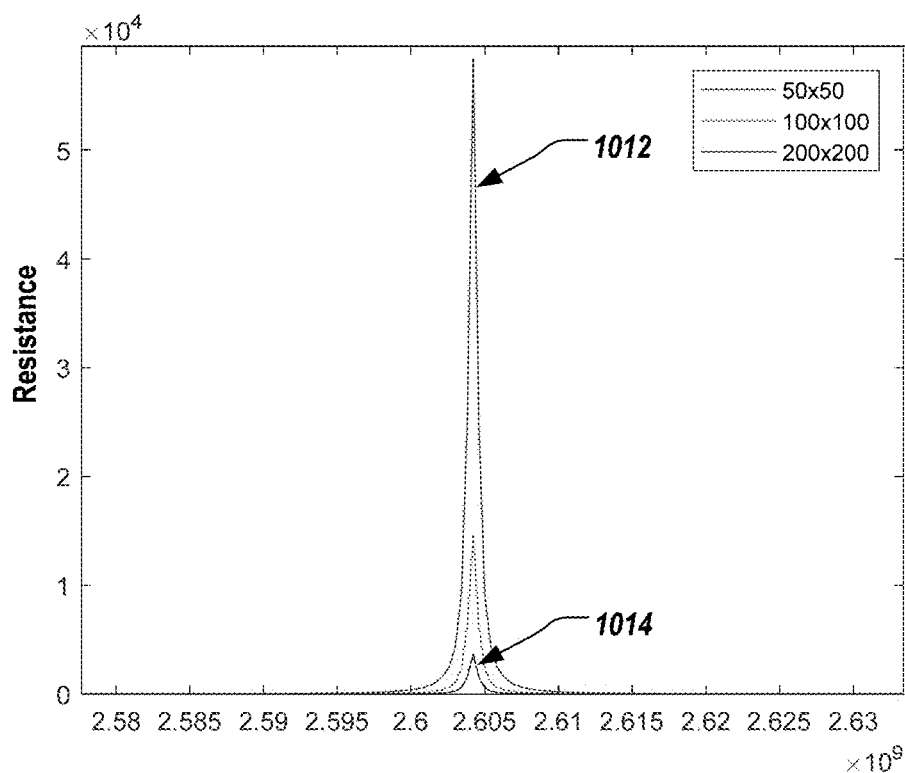

FIGS. 10A-10B illustrate an example effect of size of a resonator on the resonator's impedance and resistance at resonance and anti-resonance frequencies. FIG. 10A depicts the resonator impedance as a function of size for three different sizes, and FIG. 10B depicts the resonator resistance as a function of size for the three sizes. Plots 1002 and 1012, respectfully, depict the impedance and resistance of the smallest resonator among the three sizes. Plots 1004 and 1014, respectfully, depict the resistance of the largest resonator among the three sizes. As illustrated, the smallest resonator (1002) has the largest impedance at the anti-resonance frequency 1006 and at resonance frequency 1008. The largest resonator (1004) has the lowest impedance at the anti-resonance frequency 1006 and at the resonance frequency 1008. The smallest resonator also has the largest resistance (1012) at the anti-resonance frequency (for example as compared to the resistance of the largest resonator 1014).

A number of implementations have been described. Nevertheless, it will be understood that various modifications may be made without departing from the spirit and scope of disclosure. Accordingly, other implementations are within the scope of the following claims.

What is claimed is:

1. An acoustic wave filter device comprising:
   an acoustic wave filter element comprising interdigitated input electrodes and output electrodes located on a top surface of a piezoelectric layer; and
   a resonator comprising a resonator top electrode on the top surface of the piezoelectric layer and a resonator bottom electrode on the bottom surface of the piezoelectric layer,
   wherein the resonator is electrically connected in series to the acoustic wave filter element, wherein the resonator has a notch in resonator impedance at a first frequency that lies within a sideband of the acoustic wave filter element, and wherein the first frequency is an anti-frequency of the resonator.

2. The device of claim 1, wherein the resonator is electrically connected to the acoustic wave filter element by an electrical connection between the resonator top surface and one of the input and output electrodes of the acoustic wave filter element.

3. An acoustic wave filter device comprising:
   an acoustic wave filter element comprising input electrodes and output electrodes located on a top surface of a piezoelectric layer;
   a first resonator comprising a first resonator top electrode on the top surface of the piezoelectric layer and a first resonator bottom electrode on the bottom surface of the piezoelectric layer, the first resonator having a first notch in resonator impedance at a first frequency, wherein one of the top and the bottom electrodes of the first resonator is electrically connected to the acoustic wave filter element; and
   a second resonator coupled to the acoustic wave filter element and comprising a second resonator top electrode on the top surface of the piezoelectric layer, a second resonator bottom electrode on the bottom surface of the piezoelectric layer, and a first mass loading layer on the second resonator top electrode such that the second resonator has a second notch in resonator impedance at a second frequency that is different from the first frequency, and wherein one of the top and the bottom electrodes of the second resonator is electrically connected to the acoustic wave filter element,
   wherein the first frequency is an anti-resonance frequency of the first resonator, and the second frequency is an anti-resonance frequency of the second resonator, and wherein both the first and the second frequencies are within a sideband of resonator impedance of the acoustic wave filter element.

4. The device of claim 3, wherein the first resonator bottom electrode is electrically coupled to the input electrodes, and the second resonator bottom electrode is electrically coupled to the output electrodes.

5. The device of claim 3, wherein the first resonator top electrode is an uppermost layer of the first resonator.

6. The device of claim 3, wherein the first mass loading layer covers only a portion of the second resonator top electrode.

7. The device of claim 3, comprising a second mass loading layer on the first resonator top electrode.

8. The device of claim 7, wherein the first mass loading layer and the second mass loading layer are the same material but have different thicknesses.

9. The device of claim 7, wherein the first mass loading layer and the second mass loading layer are different materials with different density and/or different stiffness.

10. The device of claim 7, wherein the first mass loading layer does not cover the second resonator top electrode.

11. The device of claim 7, wherein the first mass loading layer covers the first resonator top electrode and the second mass loading layer does not cover the second resonator top electrode.

12. The device of claim 3, wherein the first mass loading layer is a different material than the second resonator top electrode.

13. The device of claim 3, wherein the first mass loading layer is a same material as the second resonator top electrode, and the first resonator top electrode and second resonator top electrode have different thicknesses.

14. The device of claim 3, wherein the first resonator bottom electrode is electrically connected to the acoustic wave filter element by a first conductive via extending through the piezoelectric layer, and the second resonator bottom electrode is electrically connected to the acoustic wave filter element by a second conductive via extending through the piezoelectric layer.

15. The device of claim 3, wherein the input electrodes, output electrodes, first resonator electrode, and second resonator electrode are provided by separate portions of the same electrode layer on the top surface of the piezoelectric layer.

16. The device of claim 3, wherein the first frequency and second frequency differ by at least 1%.

17. The device of claim 3, comprising a counter-electrode located on a bottom surface of the piezoelectric layer below the input electrodes and the output electrodes.

18. The device of claim 17, wherein the acoustic wave filter element is a laterally acoustically coupled bulk acoustic wave (LBAW) filter.

19. The device of claim 17, wherein a thickness of the piezoelectric layer and a gap width between the input and output electrodes is such that application of a radio frequency voltage between the input electrodes and the counter-electrode will create symmetric and antisymmetric acoustic thickness-extensional resonance modes in the piezoelectric layer.

* * * * *